United States Patent [19]

Pankove et al.

[11] Patent Number: 5,378,902
[45] Date of Patent: Jan. 3, 1995

[54] OPTOELECTRONIC MAXIMUM IDENTIFIER FOR DETECTING THE PHYSICAL LOCATION OF A MAXIMUM INTENSITY OPTICAL SIGNAL IN A WINNER-TAKE-ALL NETWORK

[75] Inventors: Jacques I. Pankove; Christian V. Radehaus, both of Boulder, Colo.

[73] Assignee: The Regents of the University of Colorado, Boulder, Colo.

[21] Appl. No.: 116,149

[22] Filed: Sep. 2, 1993

[51] Int. Cl.[6] ............................................... H01J 40/14
[52] U.S. Cl. ............................ 250/208.2; 250/214 R; 257/443
[58] Field of Search ................ 250/208.2, 214 R, 561, 250/208.3; 257/443, 458

[56] References Cited

U.S. PATENT DOCUMENTS

| | | |
|---|---|---|
| 4,908,872 | 3/1990 | Toriu et al. |
| 4,975,773 | 12/1990 | Rabii. |
| 5,012,082 | 4/1991 | Watanabe ........................ 250/208.2 |
| 5,028,969 | 7/1991 | Kasahara et al. ................ 250/208.2 |

OTHER PUBLICATIONS

Article entitled "Optoelectronic Neural Switch" Optoelectronics vol. 5, No. 2, by J. E. Pankove and C. Radehaus pp. 311-315, Dec. 1990.

*Primary Examiner*—David C. Nelms
*Assistant Examiner*—Que T. Le
*Attorney, Agent, or Firm*—Francis A. Sirr

[57] ABSTRACT

A number of light sensitive/generating devices are arranged in rows and columns to thereby form an X-Y pixel matrix. All devices are interconnected to a source of operating voltage such that the first device to turn on, i.e., the first device to receive an actuating intensity of light is actuated to thereafter emit light. The current flow through this one activated device causes a voltage drop that prevents any other light sensitive/generating device from turning on. In this way, the pixel that receives the maximum light intensity is identified by its position in the X-Y matrix. Both optical and electrical means are provided to locate the X-Y matrix position of the activated light sensitive/generating device. In an optical embodiment, two orthogonal cylindrical lenses are placed in front of two linear CCDs in order to find the X-Y coordinates of the active light sensitive/generating device. In an electrical embodiment, the X-Y coordinates of the active light sensitive/generating device is electrical read out by reading the current through row/column resistors that are associated with the active light sensitive/generating device. The use of a saw tooth source of operating voltage enables determination of the illumination intensity of the maximum light intensity pixel.

16 Claims, 5 Drawing Sheets

OPTOELECTRONIC MAXIMUM IDENTIFIER FOR DETECTING THE PHYSICAL LOCATION OF A MAXIMUM INTENSITY OPTICAL SIGNAL IN A WINNER-TAKE-ALL NETWORK

BACKGROUND OF THE INVENTION

1. Field of the Invention

This invention relates to the field of optoelectronic devices. More specifically, this invention relates to an X-Y array, or network, of pnpn solid state light sensitive devices. Each row and each column of the light sensitive devices are connected in parallel, and to a load resistor to form a Winner-Take-All (WTA) type of maximum illumination detector. In such an arrangement, activation of one device prevents any other device from subsequently being activated.

2. Description of Prior Art

In many optical signal and image processing systems, such as optoelectronic computers, optical communication systems, correlators and optoelectronic fuzzy logic systems, it is important to identify the physical location of a maximum intensity optical signal; that is, the physical location of the brightest light spot within a field of view comprising, for example, the viewing of an image that comprises an input image projected onto an array of X-Y pixels. In some cases, it is also desirable to sense the intensity of the brightest spot.

A conventional way to perform this function is to use sensor arrays and multiplexers to convert the input light image into a serial train of electrical signals that are then converted into digital data. This data is then fed into a digital computer to calculate the position of the maximum intensity spot in the input image. The present invention generates the desired maximum intensity spot data directly within the array by the use of an optoelectronic winner-take-all network.

The general concept of providing a signal output that is modified as the result of the maximum/minimum values of a signal input is known in the art. For example, U.S. Pat. No. 4,975,773 provides that an input video signal is black level expanded only when there is a dynamic range to the range of the input video signal; i.e., when the input video signal's integrated minimum value is less than a predefined limit value. When black level expansion occurs (i.e., when the input video signal's integrated minimum value is equal to or greater than the predefined limit value), the input video signal is black level expanded in a manner that considers both the video signal's integrated minimum value and the video signal's integrated maximum value.

Other concepts that involve identifying maximum amplitude signals include U.S. Pat. No. 4,908,872 which describes apparatus for extracting pattern contours from the X-Y coordinate image data that is provided by a TV camera. In this device, each image pixel has a gray level magnitude and direction, these two characteristics of a pixel defining its gray level vector. Adjacent pixels that have a direction in a defined X direction are grouped together, as are adjacent pixel having a direction in a defined Y direction. The maximum magnitude pixel for the X direction group and the maximum magnitude pixel for the Y direction group are then summed to define the pattern contour of the TV image.

The use of solid state light sensors that are connected in a winner-take-all configuration, and are operable to detect the location of maximum light intensity is suggested in the publication *OPTOELECTRONICS-Devices and Technologies*, Vol. 5, No. 2, pp. 311–315, December 1990.

The present invention relates to devices of the latter type wherein new and unusual electrical means are provided to read out the location of maximum light intensity within an input image comprising an X-Y matrix of light pixels, and to read out the magnitude of this maximum light intensity.

SUMMARY OF THE INVENTION

The present invention provides a two-dimensional (2D) network of light sensitive, solid state, pnpn devices connected in parallel and in series with a load resistor to form a winner-take-all network. The individual light sensitive devices of this 2D network have a common load resistor that is connected to a common source of operating voltage. The magnitude of the applied operating voltage determines the optical light intensity signal threshold that will activate an individual light sensitive device within the 2D array.

In a preferred embodiment of the invention, the light-sensitive devices of this 2D network are also light emitters; i.e., when a device is activated by input light, the device operates to indicate this activation by generating and emitting light from the activated device. Devices of this type are characterized as light-sensitive/generating devices.

The device activated by an input light signal causes current to flow through the above-mentioned common load resistor. The resulting voltage drop across this load resistor operates to lower the voltage that appears across all other devices. As a result, all other devices are rendered inoperative in that they no longer have the proper magnitude operating voltage applied thereto. The one activated device remains in an activated state with this same magnitude lower voltage applied thereto. This one device remains activated so long as a voltage greater than the "holding voltage" remains applied thereto.

As soon as the location of the activated device within the array has been identified, the source of applied voltage for the array can be momentarily interrupted to reset the array, thus preparing the array to view another light scene or light frame.

As a further feature of the invention, the source of operating voltage for the device array comprises a gradually increasing magnitude source, such as a saw tooth waveform source. In this way, the source of operating voltage causes the devices to scan through a range of light sensitivities. When the voltage reaches a threshold value corresponding to the light intensity of the maximum intensity spot or pixel within the image being viewed by the array, the corresponding device is activated. The magnitude of the voltage that appears across the array now drops as a result of the voltage drop that now occurs across the above-mentioned load resistor. Measurement of the time delay that occurred between the initial application of the source waveform and the lowering of the applied voltage as a result of current flow is a function of the intensity of the brightest spot within the input scene being viewed by the array. The location of the activated device corresponds to the location of this brightest spot within the scene. Again, all other devices remain inactive due to this lowering of the magnitude of the voltage across the array. Once both the above-mentioned time delay and device location have been determined, the source may be interrupted to begin a new sensing cycle.

A 2D X-Y array of such devices provides that all devices are interconnected to form a plurality of columns that run in the Y direction, and a plurality of rows that run in the X direction. Each device resides in one row and in one column of the array.

In an electrical read-out embodiment of the invention, a column resistor is provided for each column, and a row resistor is provided for each row. Each individual device in a given row is first connected in series with its unique column resistor. These series circuits are then connected in parallel. Each such parallel circuit is then connected in series with a load resistor, and with the row resistor that corresponds to the given row.

In a like manner, each individual device in a given column is first connected in series with its unique row resistor. These series circuits are then connected in parallel and to the second terminal of the voltage supply.

When a device is activated, as above described, a voltage drop occurs across only the row resistor and the column resistor that correspond to, or intersect at, the activated device. The location of this intercept is electrically read by a detection device that operates as an X-Y coordinate identifier. In this way, the location of the brightest spot in the input image being viewed is identified electronically.

While the use of resistors is preferred, as above described, inductors can be used to generate a voltage spike across the inductor during current switching.

In an optical read-out embodiment of the invention, a cylindrical lens and a CCD array are positioned adjacent to both the X axis and the Y axis of the array of light sensitive/generating devices. Electronic scanning means operate to scan the individual CCD elements associated with the X and Y axes. In this way, electronic scanning provides an output indicating that an activated light sensitive/generating device is located at the intersection of a given column and row.

While the invention is not to be limited to the specific structure of the sensor array, solid state pnpn devices, based upon visible ultra violet light sensitive GaN and light sensitive GaAs and GaAlAs, are suggested. More generally, the sensor array comprises a solid state chip based upon a material chosen among III-V compound semiconductors and their alloys.

An object of the invention is to provide a device for detecting the physical position of the maximum illumination within an input light imaged onto pixels, the input pixels being arranged in a plurality of rows and a plurality of columns. A corresponding array of electrically operable illumination sensitive/generating devices is provided; one device for each of the input pixels, and each device corresponding to an input pixel that is common to a row of pixels and to a column of pixels within the input image. A first circuit means connects each row of illumination sensitive/generating devices in parallel. A second circuit means connects each column of the illumination sensitive/generating devices in parallel. A source of operating voltage is provided for the illumination sensitive/generating devices, and a third circuit means connects the source of operating voltage and a load impedance to each of the first and second circuit means, such that when one of the illumination sensitive/generating devices is subjected to illumination of an activating light intensity, current flow through the one illumination sensitive/generating device operates to cause a voltage drop to occur across the load resistor, this voltage drop being of a magnitude sufficient to prevent activation of any other of the said sensitive/generating devices. A means is then operable to identify the physical location of the one illumination sensitive/generating device.

As a feature of the invention, the identifying means is an optical means.

As a further feature of the invention, the identifying means is an electrical means.

These and other objects and advantages of the invention will be apparent upon reference to the following detailed description of the invention, which description makes reference to the drawing.

DESCRIPTION OF THE PREFERRED EMBODIMENTS

The present invention utilizes a two-dimensional network of light sensitive, solid state, pnpn devices connected parallel to form a winner-take-all network. The light sensitive devices of this network have a common load resistor that is connected to a common source of operating voltage. The magnitude of the applied voltage from this source determines the optical light intensity signal threshold that will activate an individual light sensitive device within the array. When one of the devices is activated by light, a current flows through the common load resistor, resulting in a reduction of the voltage that is applied to all non-activated devices, such that these non-activated devices cannot be subsequently activated by light.

Figure 1:
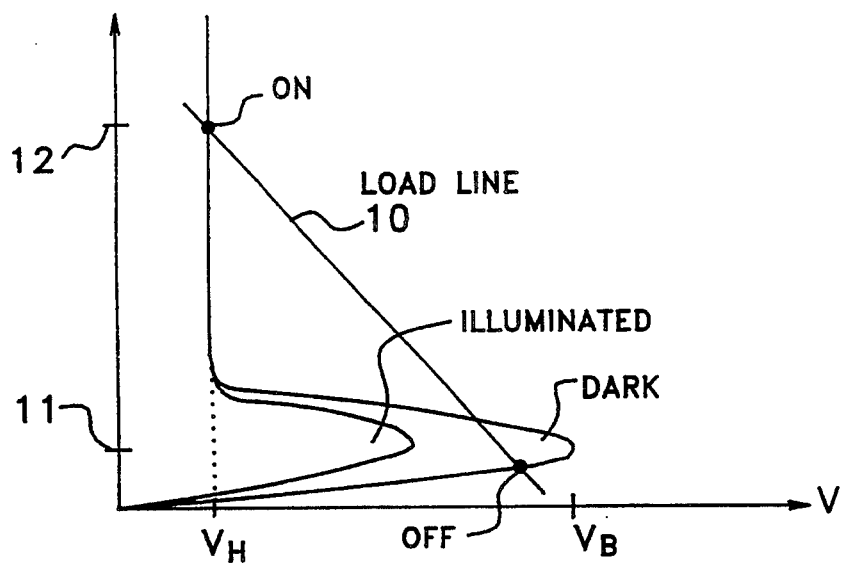
FIG. 1 shows the current/voltage (I/V) characteristic of a pnpn photothyristor of the type used in the invention.

FIG. 1 shows the current/voltage (I/V) characteristic of a solid state pnpn photothyristor of the type used in the invention. The breakdown voltage Vb of the device is determined either by zener breakdown or by punch through, depending on the design of the device's central pn junction. Light causes a lowering of the breakdown voltage Vb. With the exemplary resistance load line shown at 10, the device is bistable in that it switches from a low current value, such as 11, and a high voltage value in the dark, to a high current value 12 and low voltage level after receiving activating illumination. The device remains in this activated high current, low-voltage state as long as its biasing voltage exceeds the holding voltage value Vh. The device switches off when the voltage across the devices is reduced to less than the holding value Vh. When a number of such pnpn devices are connected in a parallel array and to a source of operation voltage through an appropriate common load impedance, the one device that receives the highest intensity of light will switch to its high current 12, low-voltage state causing a voltage drop across the entire array of devices. That is, the load impedance and voltage level (57 and 56, respectively, in FIG. 4) are selected for supporting only one device or pixel in the "on" state after which that device becomes latched "on." Thus, it is preferable that only one device will turn on, and all other devices will remain off independent upon the intensity of light subsequently received by these other devices. Note that, under some circumstances, having more than one pixel "on" might be acceptable.

Figure 2:
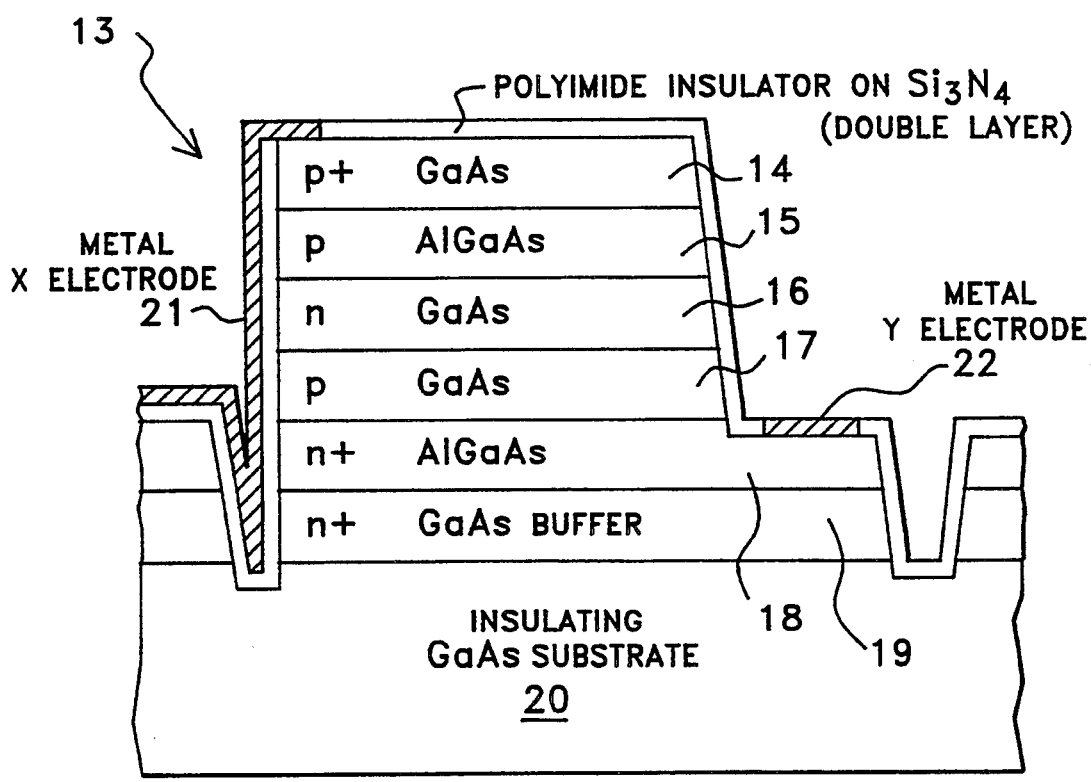
FIG. 2 is a cross-sectional view of a pnpn device of the type having the I/V characteristic shown in FIG. 1.

FIG. 2 is a cross-sectional view of a pnpn device 13 of the type having an I/V characteristic of the type shown in FIG. 1. The layer sequence of this exemplary device comprises p+ GaAs layer 14, p+ AlGaAs layer 15, n GaAs layer 16, p− GaAs layer 17, p+ AlGaAs layer 18, p+ buffer layer 19, and an insulating GaAs substrate 20. Electrically conductive electrodes 21 and 22 are connected to layers 14 and 18 or 19, respectively.

In this structure, layers 14, 15 comprise a p layer, layer 16 comprises an n layer, layer 17 comprises a p layer, and layers 18, 19 comprise an n layer, thus making up the pnpn device structure.

A preferred embodiment of the present invention utilizes a two-dimensional network of light sensitive, solid state pnpn devices of the type shown in FIG. 2 wherein the devices are connected in row-parallel and column-parallel to form a winner-take-all network.

Figure 3:
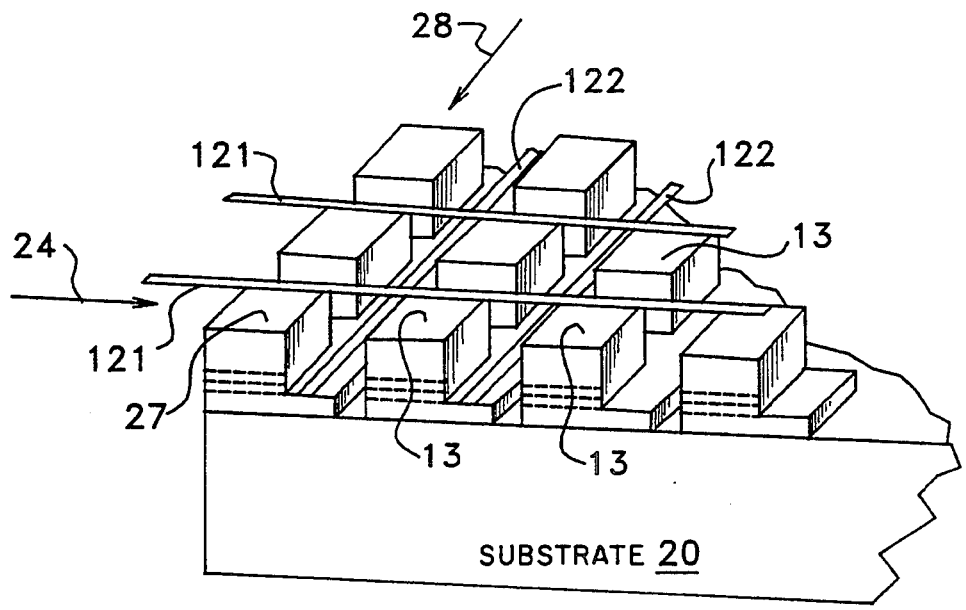
FIG. 3 shows a portion of a monolithic array of pnpn optoelectronic devices, or switches, of the type shown in FIG. 2 wherein the devices are connected in parallel as shown in FIG. 4.
Figure 4:
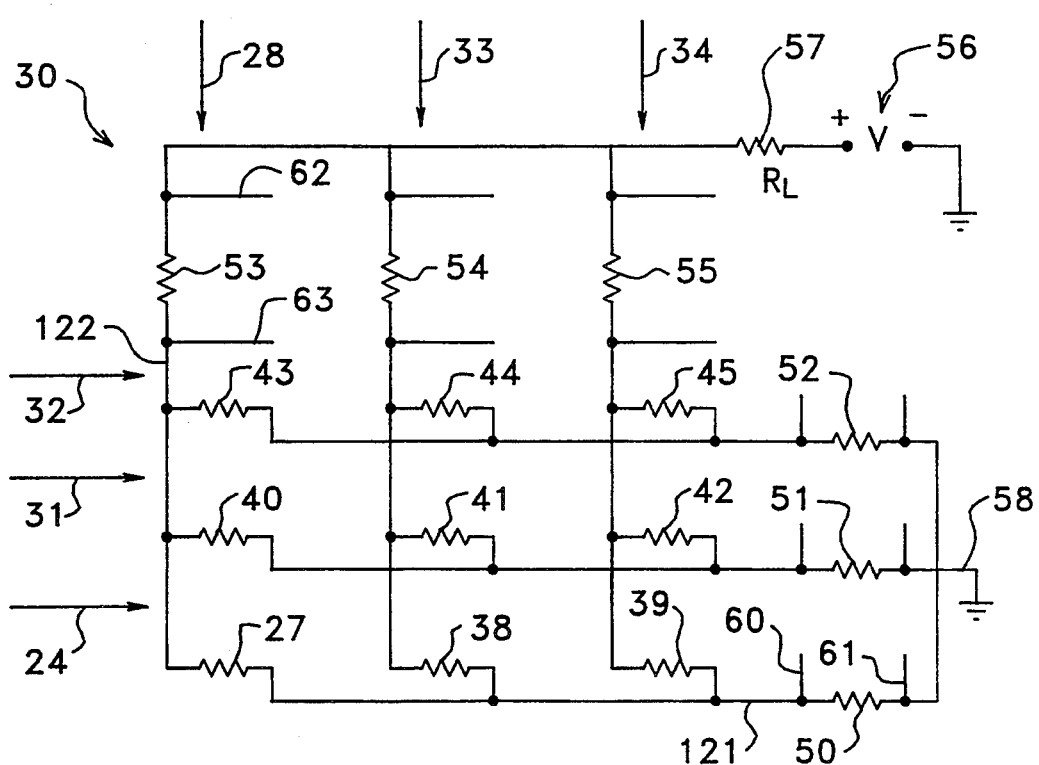
FIG. 4 is a schematic showing of a three row, three column, array of devices of the types shown in FIGS. 2 and 3 wherein the devices are connected in row parallel and column parallel, and wherein read out of this embodiment of the invention is provided by electrical means.

FIG. 3 shows a portion of a monolithic two-dimensional array of pnpn optoelectronic devices or switches of the type shown in FIG. 2 wherein the devices are connected in parallel, as shown schematically in FIG. 4. In FIG. 3, each device 13 constitutes a picture element or pixel that occupies a physical location in both a row and a column of the array. For example, device 27 is located in a row that is identified by arrow 24, and in a column that is identified by arrow 28. The two electrodes 21 and 22 (see FIG. 2) of each device are connected to row conductors or buses 121 and column conductors or buses 122, respectively. As will be apparent, conductors 121 and 122 are connected so as to place all devices in electrical row-parallel and column-parallel circuits, respectively. In this way, should device 27 be activated by receiving the maximum pixel illumination (i.e., a higher illumination than any other of the devices 13), then a current will flow through row conductor 121 and column conductor 122 that are associated with device 27. The magnitude of the voltage thereafter supplied to all devices 13, including device 27, is now too low to permit activating devices other than 27. That is, device 27 has switched. Device 27 carries current and emits light and the other devices do not. They cannot because now the voltage is too low.

FIG. 4 is a schematic showing of a three row, three column array of devices 13 of the type shown in FIGS. 2 and 3 wherein the devices are connected in row-parallel and column-parallel. Row arrow 24, column arrow 28, device 27, row conductor 121 and column conductor 122 are identified as in FIG. 3 in order to correlate FIGS. 3 and 4.

The three-by-three pixel array of FIG. 4 can, of course, be of any size, and usually will be much larger than the small X-Y array shown in FIG. 4. The three rows of array 30 comprise rows 24, 31 and 32. The three columns of array 30 comprise columns 28, 33 and 34. For purposes of convenience, and without limitation thereto, each of the nine light-sensitive devices contained within array 30 are represented by the well-known symbol of a resistor, although a "black box" showing would also be accurate. As stated previously, each such device may be of the type that emits light when activated by an input light image. As such, the devices would then be designated as a light sensitive/generating device.

Row 24 of array 30 contains devices 27, 38 and 39, whereas row 31 contains devices 40–42, and row 32 contains devices 43–45. Column 28 of array 30 contains devices 27, 40 and 43, whereas column 33 contains devices 38, 41 and 44, and column 34 contains devices 39, 42 and 45.

As is apparent from FIG. 4, all devices within any given row of array 30 are connected in parallel, and then in series with a row resistor 50–52 that is unique to that row. Likewise, all devices within any given column of array 30 are connected in parallel and then in series with a column resistor 53–55 that is unique to that column. As a result of the above-defined row/column, parallel/series connection, each device is connected in a circuit that contains a row resistor that is unique to that device row, and a column resistor that is unique to that device column.

For example, and considering device 27, device 27 is connected in row-parallel with devices 38 and 39, whereas device 27 is also connected in column-parallel with devices 40 and 43. The circuit containing device 27 contains column resistor 53 that is unique to the column 28 that includes device 27. This circuit also contains row resistor 50 that is unique to the row 24 that includes device 27.

Operating power or voltage for array 30 is provided by DC source 56 having the polarity indicated.

All column resistors 53–55 are connected in parallel to source 50 through a common load resistor 57, whereas all row resistors 50–52 are connected in parallel to the common ground 58 of source 56.

Relatively speaking, and without limitation thereto, in a preferred embodiment of the invention, load resistor 57 was a high magnitude resistor, whereas the row and column resistors were all low magnitude resistors.

The electrical output of array 30 comprises the voltage that is currently present across row resistors 50–52 and column resistors 53–55. Each of these six resistors is shown as having a pair of electrical connections associated therewith; for example, row resistor 50 is provided with output conductors 60 and 61 whereas column resistor 53 is provided with output conductors 62 and 63.

Figure 5:
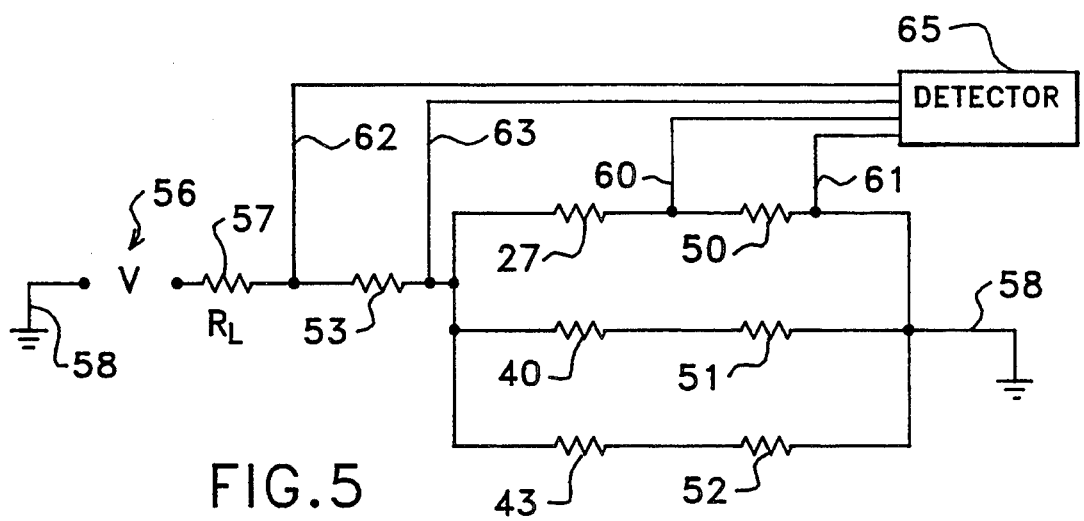
FIGS. 5 and 6 are respectively the portions of the FIG. 4 circuit that comprise row 28 and column 24 of FIG. 4, this row/column combination being unique to only light sensitive device 27 of FIG. 4.
Figure 6:
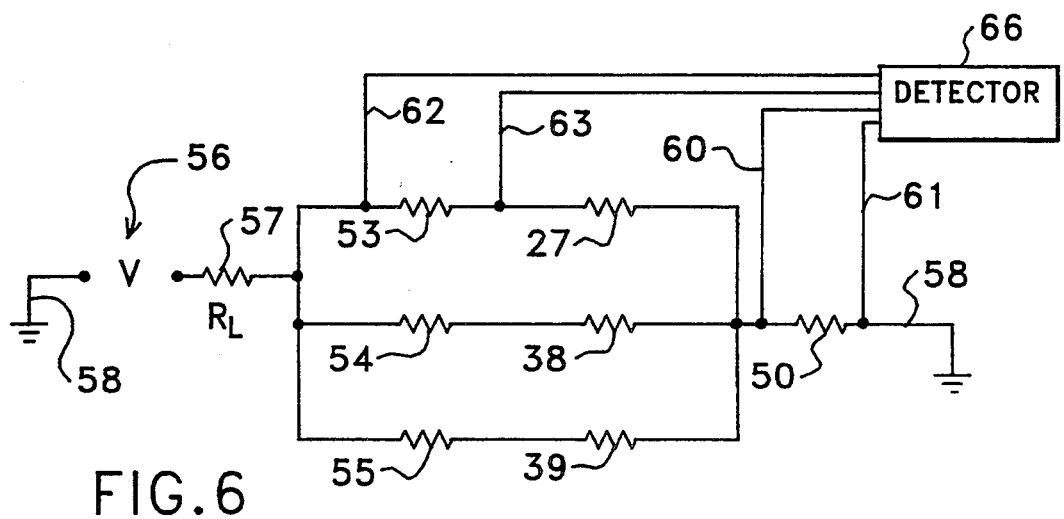

FIGS. 5 and 6 are, respectively, showings of the circuit portions of FIG. 4 that comprise row 28 and column 24 of FIG. 4. This row/column combination is the only FIG. 4 row/column combination that includes light sensitive device 27 in both the row and the column of the combination. FIGS. 5 and 6 will be used to explain the operation of FIG. 4 when device 27 is the first light sensitive device to be light activated.

It will be assumed that array 30 of FIG. 4 is provided with a nine pixel input light image. The nine devices of FIG. 4 individually view a different one of this nine pixel input image. Also, assuming that the input image pixel corresponding to light sensitive device 27 is the image pixel of maximum intensity, then device 27 will be activated by this assumed input image. With reference to both FIG. 5 and FIG. 6, in this assumed case, a current now flows through resistor 57, column resistor 53, device 27, and row resistor 50. The resulting voltage drop across load resistor 57 causes the operating voltage across each light sensitive device of FIG. 4 to drop to a low value as above discussed in relation to FIG. 1. As a result, device 27 remains activated, but no other light sensitive device of array 30 now has an operating voltage applied thereto. Device 27 remains activated in a winner-takes-all sense.

FIGS. 5 and 6 show detector means 65 and 66 (differential amplifiers) that are connected to detect the voltages across column resistor 53 and row resistor 50. Detector means 65 and 66 operate as X-Y coordinate identifiers for array 30. While not shown in FIG. 6, it will be understood that detector means 65 is connected to all of the column resistors 53, 54, 55 shown in FIG. 4. In this way, detector 65 is responsive to the voltage present across, or the current flow through, each of the column resistors of FIG. 4. For purposes of convenience only, detector 65 is not shown in FIG. 4. Similarly, while not shown in FIG. 6, row detector 66 is connected to all of the row resistors 50, 51, 52 shown in FIG. 4. As is apparent from the above description, a detector means detects that only the resistor pair comprising row resistor 50 and column resistor 53 have a voltage there across, thus indicating to detectors 65 and 66 that only light sensitive device 27 has been activated. In this way, detectors 65 and 66 provide an X-Y output indicating that the input image pixel corresponding to light sensitive device 27 is the input pixel of maximum intensity.

In the embodiment of FIG. 6, detector 65 measures that column resistor 53 has a potential drop thereacross. Therefore, only a device in column 53 must be carrying a current.

In a like manner, it can be seen that FIG. 4 provides a row/column combination similar to FIGS. 5 and 6 wherein a row/column combination includes a unique one of the light sensitive devices in both the row and the column of the combination. Thus, detectors 65 and 66 are enabled to detect which one of the nine light sensitive devices of FIG. 4 has been activated.

Figure 7:
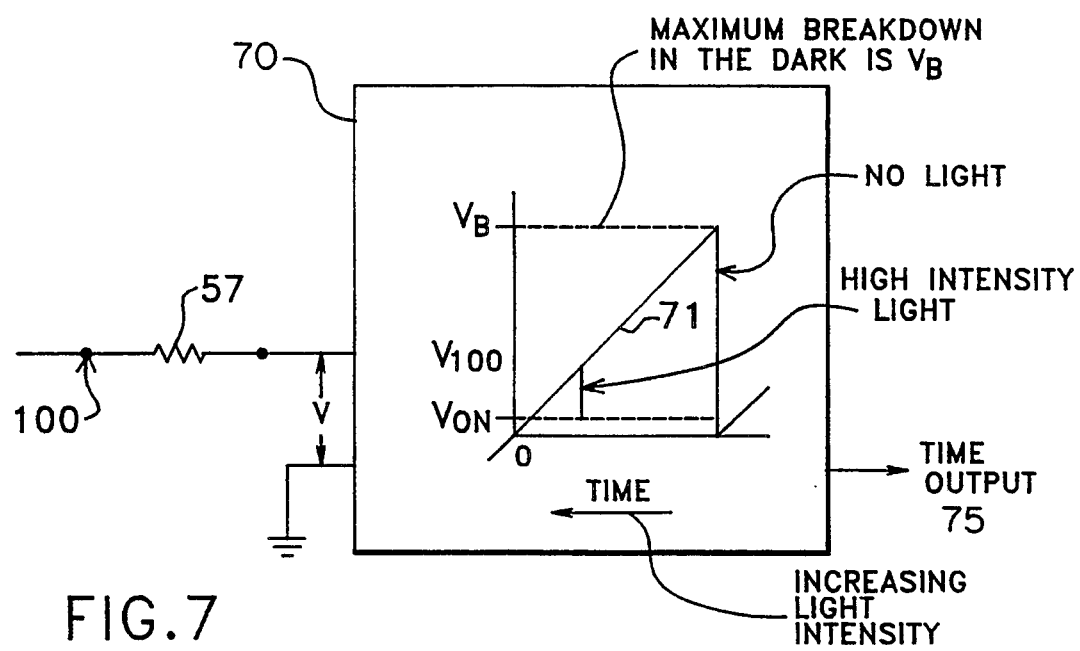
FIG. 7 shows a feature of the invention wherein the source of operating voltage for the array comprises a saw tooth voltage waveform such that a range of input image pixel illumination intensities is scanned as a function of the time within voltage waveform 71 at which a device is activated.

FIG. 7 illustrates a feature of the invention wherein the source of operating voltage for array 30 comprises a gradually increasing, or saw tooth voltage source 70, having output voltage waveform 71, as illustrated. Use of source 70 enables measurement of the intensity value of the brightest pixel within the input image to be scanned. This intensity measurement is made as a function of the time, time being shown as the time axis of voltage waveform 71. The time at which a light sensitive device is activated is a measure of the pixel's illumination intensity, i.e., the sooner in waveform 71 a device is activated, the brighter is the input image pixel. Source 70 detects the time of actuation of a light sensitive device by monitoring the voltage present across load resistor 57. In this arrangement, the output of detectors 65 and 66 (FIGS. 5 and 6) identifies the physical location of the maximum intensity image pixel, and the duration of the voltage ramp 71 from source 70 determines the illumination intensity of this input image pixel, said voltage ramp being measured at point 100 of the load resistor.

Figure 8:
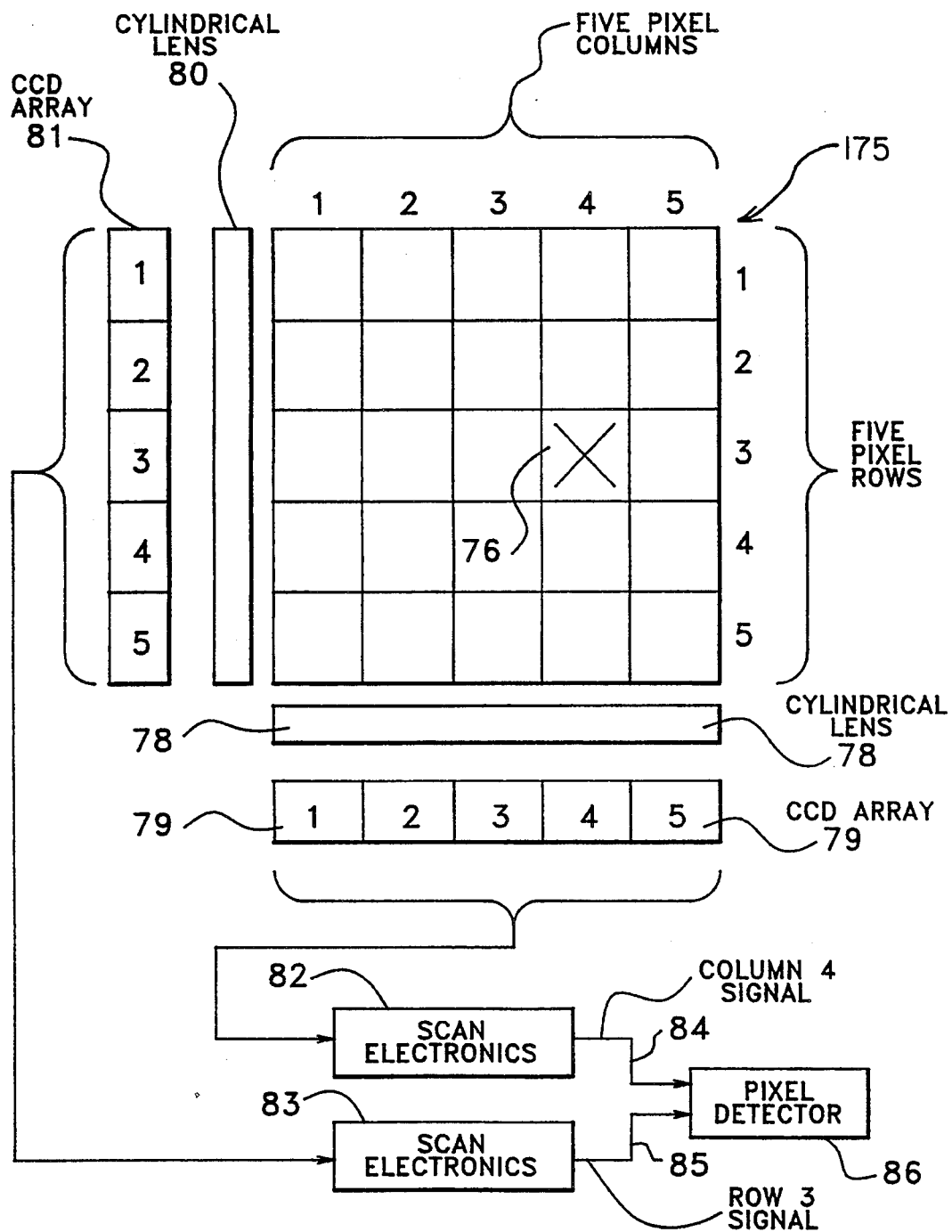
FIG. 8 is a showing of a five row, five column, array of devices of the types shown in FIGS. 2, 3 and 4 wherein the devices are connected in row parallel and column parallel, and wherein read out of this embodiment of the invention is provided by optical means.

An optical read-out embodiment of the invention is shown in FIG. 8. In this device, a five-by-five pixel array 175 of light sensitive/generating devices are connected in winner-take-all manner, such as is shown in greater detail in FIG. 4. While the row and column resistors of FIG. 4 are not used in this optical embodiment, these resistors can be included in array 175, if desired.

In FIG. 8, the various rows and columns are numerically identified by numerals 1 through 5. In an exemplary situation to be explained, the light sensitive/generating device 76 has the maximum intensity pixel of an input light image at the position identified as column 4, row 3. This has caused device 76 to generate light to the exclusion of any other device in array 175, as above described. As above described, this effect is due to the current flow through light sensitive/generating device 76, and the resulting voltage drop across load resistor 57 of FIG. 4.

In this embodiment of the invention, a cylindrical lens and a CCD linear array are positioned to be aligned with their axes parallel to both the X axis and the Y axis of array 175. More specifically, cylindrical lens 78 and linear CCD array 79 are located parallel to the X axis of array 175, and cylindrical lens 80 and linear CCD array 81 are located parallel to the Y axis of array 175. Linear CCD arrays 79 and 81 may view pixel array 175 through a beam splitter. CCD array 79 comprises five individual CCD elements, each element being operable to view a different one of the five columns of array 175. This is indicated by the number correspondence between the array columns and the individual CCD elements. In a like manner, CCD array 81 comprises five individual CCD elements, each element being operable to view a different one of the five rows of array 175.

Scan electronic means 82 is operable to scan the five individual CCD elements of CCD array 79, one by one, in the sequence CCD element one to CCD element five, whereas scan electronic means 83 is operable to scan the five individual CCD elements of CCD array 81, one by one, in the CCD element sequence CCD element one to CCD element five. In this way, electronic scanning means 82 provides an output 84 indicating that activated light sensitive/generating device 76 is located in column 4 of array 175, and electronic scanning means 83 indicates the signal 85 that activated light sensitive/generating device 76 is located in row 3. Pixel detector 86 receives signals 84 and 85 as an input, and provides an output indicating that the maximum illumination intensity pixel in the input light image is located at the intersection of row 3 and column 4; i.e., the location of light sensitive/generating device 76.

When array 175 is energized by a voltage source having a magnitude that gradually increases with time, such as is shown in FIG. 7, one can combine the position identifying function of pixel detector 86 with the intensity determinator described in connection with FIG. 7. In this manner, the intensity level of the input image pixel corresponding to light sensitive/generating device 76 is measured.

Figure 9:
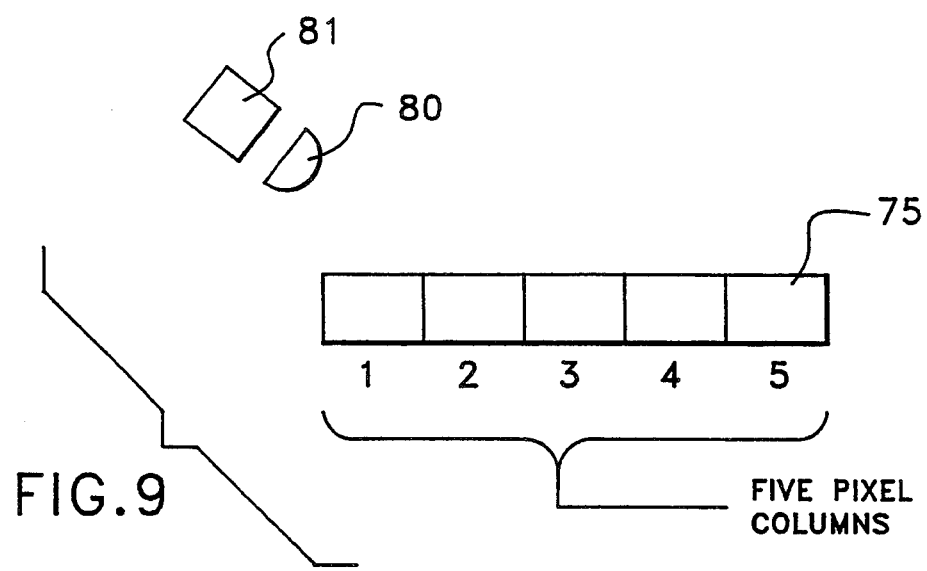
FIG. 9 is a side view of a portion of the FIG. 8 embodiment of the invention.
Figure 10:
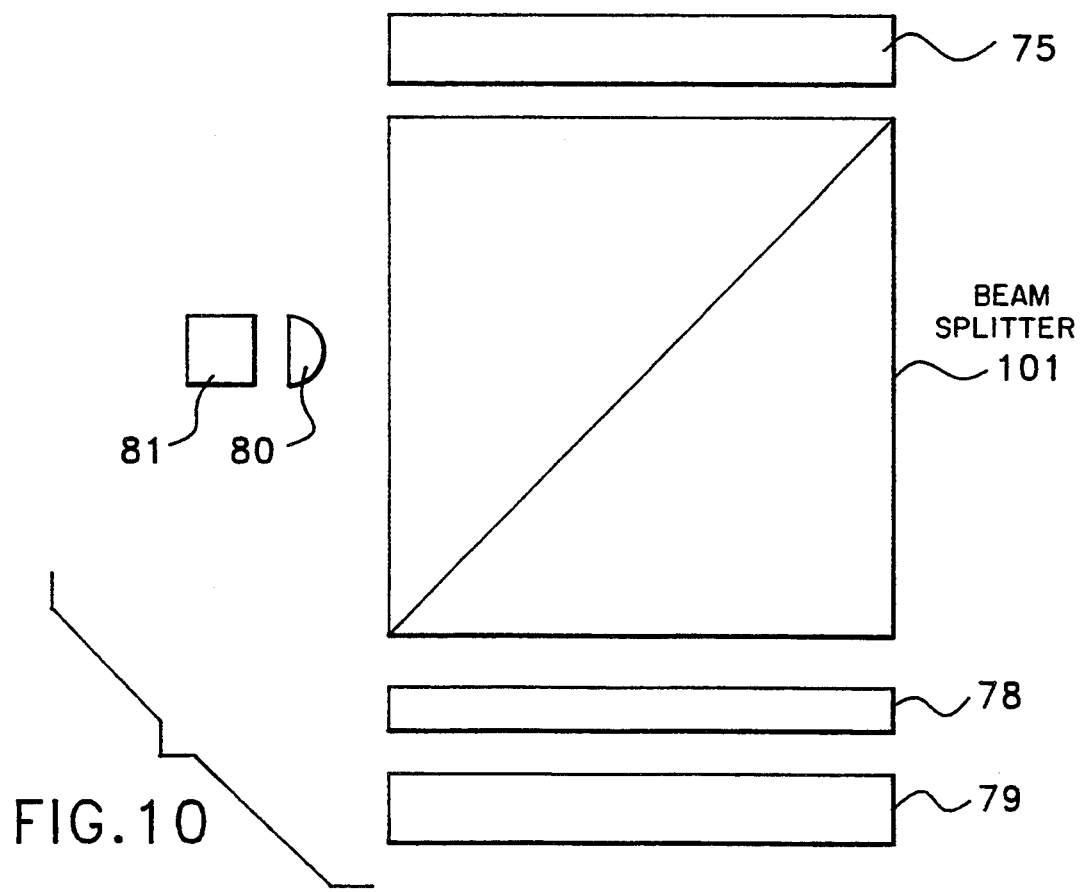
FIG. 10 shows the FIGS. 8 and 9 embodiment of the invention wherein the two CCD arrays view the pixel array through a beam splitter.

In another configuration, FIG. 9 shows the manner in which the two cylindrical lenses of FIG. 8 are spaced from the plane of array 175, and the manner in which lenses 78 and 81 are tilted to view the entire column/row composition of array 175. For simplicity, FIG. 9 shows only cylindrical lens 80 and CCD array 81 that views the five rows of array 175.

While the invention has been described making reference to details of various embodiments thereof, it is recognized that those skilled in the art will readily visualize yet other embodiments that are within the spirit and scope of the invention. Thus it is not intended that the above detailed description be considered a limitation on the invention.

What is claimed is:

1. Apparatus for detecting the physical position of the maximum illumination in a light projected onto a two-dimensional array of pixelated devices said pixels being arranged in a plurality of rows and a plurality of columns, the apparatus comprising:

a corresponding array of electrically operable illumination sensitive pixelated devices, one pixelated device for each of said input pixels, each device belonging to one row and to one column of the two-dimensional array of pixelated devices, first circuit means connecting each row of said illumination sensitive devices in parallel and then in series with a common row resistor, second circuit means connecting each column of said illumination sensitive devices in parallel and then in series with a common column resistor, a source of operating voltage for said illumination sensitive devices, a load resistor, third circuit means connecting said source of operating voltage and said load impedance to each of said first and second circuit means, such that when one of said illumination sensitive devices is subjected to illumination of an activating light intensity, current flow through said one illumination sensitive device operates to cause a voltage drop to occur (1) across said common row resistor within said first circuit means that is connected to said one illumination sensitive device, (2) across said common column resistor within said second circuit means that is connected to said one illumination sensitive device, and (3) across said load resistor, said voltage drop across said load resistor being of a magnitude sufficient to prevent the subsequent activation of any other of said illumination sensitive devices, and voltage sensitive means connected to common row resistors and to said common column resistors and operable to identify the physical location of said one illumination sensitized pixelated device.

2. The device of claim 1 wherein said array of illumination sensitive devices comprise devices that generate light when activated by light exceeding a voltage-determined threshold value.

3. The device of claim 2 wherein said array comprises a solid state pnpn chip based upon the material group: GaN, GaAlAs, GaAs, and GaAlN.

4. The device of claim 1 wherein said source of operating voltage comprises a time increasing voltage waveform, such that a range of threshold illumination intensities within said input image pixels is scanned as a function of time by said voltage waveform.

5. The device of claim 4 wherein said array of illumination sensitive devices generate light when activated by light exceeding a voltage-determined threshold value.

6. The device of claim 5 wherein said illuminations sensitive devices are fabricated into a solid state chip based upon a material chosen among III–V compounds and their alloys.

7. A device for detecting the physical position of a maximum illumination pixel that is provided by an X-Y row-column array of pixels, comprising:

a corresponding X-Y array of electrically operable illumination sensitive devices, one device for each of said pixels, first circuit means connecting the illumination sensitive devices of each row in parallel and then in series with an individual row impedance for each row, second circuit means connecting the illumination sensitive devices of each column in parallel and then in series with an individual column impedance for each column, a common source of operating voltage for said illumination sensitive devices, a common load impedance, third circuit means connecting said source of operating voltage and said load impedance in series and then in parallel with said first and second circuit means, such that when one of said illumination sensitive devices is subjected to illumination of an activating light intensity, said one illumination sensitive device operates to cause a voltage drop to occur across its corresponding individual row impedance and its corresponding column impedance and across said load impedance, the voltage drop across said load impedance being of a magnitude sufficient to prevent the subsequent activation of any other illumination sensitive device of said array, and pixel identification means responsive to the voltage across said corresponding row impedance and said corresponding column impedance operable to identify the physical location within said array of said one illumination sensitive device.

8. The device of claim 7 wherein said illumination sensitive devices comprise a solid state chip formed from the group GaN, GaAs, GaAlAs and GaAlN.

9. The device of claim 8 wherein said devices are pnpn photothyristors.

10. The device of claim 7 wherein said source of operating voltage comprises a saw tooth voltage waveform, such that a range of illumination intensities within said array of pixels is scanned by said voltage waveform, and means for measuring a time interval within said saw tooth voltage waveform whereat said one illumination sensitive device becomes operative.

11. A device for detecting the physical position of the maximum illumination pixel within a pixelated input light image, said input pixels being arranged in a plurality of rows and a plurality of columns, the device comprising:

a corresponding array of electrically operable illumination-sensitive/light-generating devices, one device for each of said input pixels, each device belonging to a row of pixels, first circuit means connecting each row of said illumination sensitive/generating devices in parallel, second circuit means connecting each column of said illumination sensitive/generating devices in parallel, a source of operating voltage for said illumination sensitive/generating devices, a load resistor, third circuit means connecting said source of operating voltage and said load impedance to each of said first and second circuit means, such that when one of said illumination sensitive/generating devices is subjected to illumination of an activating light intensity, current flow through said one illumination sensitive/generating device operates to cause a voltage drop to occur across said load resistor, said voltage drop across said load resistor being of a magnitude sufficient to prevent activation of any other of said illumination sensitive/generating devices, and means operable to identify the physical location of said one illumination sensitive/generating device.

12. The device of claim 11 wherein said last named means comprises an optical means.

13. The device of claim 11 wherein said last named means comprises an electrical means.

14. The device of claim 11 wherein said array of illumination-sensitive/light-generating devices is comprised of a solid state chip fabricated from III–V compound semiconductors or their alloys.

15. A device for detecting the physical position of the maximum illumination pixel within an input light image of pixels comprising a plurality of pixel rows and a plurality of pixel columns, each individual input image pixel residing in one row and in one column of said input image, the device comprising:

a corresponding array of electrically operable illumination-sensitive/light-generating devices, one device for each of said input pixels, a plurality of first circuit means connection each illumination-sensitive/light-generating device in a row in parallel, a plurality of second circuit means connecting each illumination-sensitive/light-generating device in a column in parallel, a source of operating voltage, a load resistor, a plurality of third circuit means connecting said plurality of first circuit means and said plurality of second circuit means to said source of operating voltage through said load resistor, such that when one of said illumination-sensitive/light-generating devices is subjected to illumination of an activating light intensity, current flow through said one illumination-sensitive/light-generating device operates to cause said one device to generate light and to cause a voltage drop to occur across said load resistor, said voltage drop across said load resistor being of a magnitude sufficient to prevent the activation of any other of said illumination-sensitive/light-generating devices, a first cylindrical lens and a first linear CCD array physically located to view the columns of said array of light-sensitive/light-generating devices, a second cylindrical lens and a second linear CCD array physically located to view the rows of said array of light sensitive/generating devices, and detector means connected to said first and second CCD arrays and operable to detect the row-column location of an activated light-sensitive/light-generating device in said array of light-sensitive/light-generating devices.

16. The device of claim 15 wherein said source of operating voltage comprises a source whose voltage magnitude increases as a function of time, said voltage source being responsive to said detector means and operating such that a range of illumination intensities within said input image pixels is scanned as a function of time by said voltage source.

* * * * *